(12) United States Patent
Yang et al.

(10) Patent No.: US 12,255,592 B2
(45) Date of Patent: Mar. 18, 2025

(54) ELECTRONIC DEVICE INCLUDING A PLURALITY OF POWER AMPLIFIERS AND OPERATING METHOD THEREOF

(71) Applicant: SAMSUNG ELECTRONICS CO., LTD., Suwon-si (KR)

(72) Inventors: Jaejin Yang, Suwon-si (KR); Hyoseok Na, Suwon-si (KR); Yongjun An, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 526 days.

(21) Appl. No.: 17/720,014

(22) Filed: Apr. 13, 2022

(65) Prior Publication Data

US 2022/0329221 A1 Oct. 13, 2022

Related U.S. Application Data

(63) Continuation of application No. PCT/KR2022/004636, filed on Mar. 31, 2022.

(30) Foreign Application Priority Data

Apr. 7, 2021 (KR) .................. 10-2021-0044994

(51) Int. Cl.
H03F 3/26 (2006.01)
H03F 3/00 (2006.01)
(52) U.S. Cl.
CPC .............. *H03F 3/26* (2013.01); *H03F 3/005* (2013.01)
(58) Field of Classification Search
CPC ... H03F 3/26; H03F 3/005; H03F 3/19; H03F 3/72; H03F 3/211; H03F 1/0277;
(Continued)

(56) References Cited

U.S. PATENT DOCUMENTS 8,659,355 B2   2/2014 Henshaw et al.
9,225,362 B2 * 12/2015 Drogi .................... H03F 1/0227
(Continued)

FOREIGN PATENT DOCUMENTS

CN    104579201    4/2015
JP      3842603   11/2006
(Continued)

OTHER PUBLICATIONS

Search Report and Written Opinion dated Jul. 8, 2022 issued in International Patent Application No. PCT/KR2022/004636.

*Primary Examiner* — Andrea Lindgren Baltzell
*Assistant Examiner* — Nareh Shamiryan
(74) *Attorney, Agent, or Firm* — Nixon & Vanderhye, P.C.

(57) ABSTRACT

Various embodiments of the disclosure relate to a device and a method for supplying power to a plurality of power amplifiers in an electronic device. An electronic device may include: a first power amplifier, a second power amplifier, a third power amplifier, a first power supply module including a power supply configured to supply power to the first power amplifier or the second power amplifier, a second power supply module including a power supply configured to supply power to the second power amplifier or the third power amplifier, and a detection module comprising circuitry configured to identify a state of a connection between the second power amplifier and the first power supply module and a state of a connection between the second power amplifier and the second power supply module, wherein the detection module may be configured to output a power control signal based on detecting that the second power amplifier is connected to the first power supply module and the second power supply module, wherein power supply to the second power amplifier from the first power supply module or the second power supply module (Continued)

may be shut off based on the power control signal of the detection module.

20 Claims, 6 Drawing Sheets

(58) Field of Classification Search
CPC ......... H03F 2200/451; H03F 2200/507; H03F 2203/7227; H03F 2203/21196; H03F 1/083; H03F 1/308; H03F 1/52
See application file for complete search history.

(56) References Cited

U.S. PATENT DOCUMENTS

| | | |
|---|---|---|
| 9,515,621 B2 | 12/2016 | Hietala et al. |
| 9,535,491 B2 | 1/2017 | Drogi et al. |
| 2003/0231441 A1 | 12/2003 | Testin |
| 2010/0283442 A1 | 11/2010 | Nakashima |
| 2012/0001695 A1 | 1/2012 | Seki et al. |
| 2012/0112838 A1* | 5/2012 | Hase .................. H03G 3/3042 330/296 |
| 2020/0313703 A1 | 10/2020 | Choi et al. |
| 2021/0083635 A1 | 3/2021 | Kim et al. |

FOREIGN PATENT DOCUMENTS

| | | |
|---|---|---|
| JP | 3982620 | 9/2007 |
| JP | 2009-148094 | 7/2009 |
| JP | 2020-156024 | 9/2020 |
| KR | 2002-0071215 | 9/2002 |
| KR | 10-2021-0033344 | 3/2021 |

\* cited by examiner

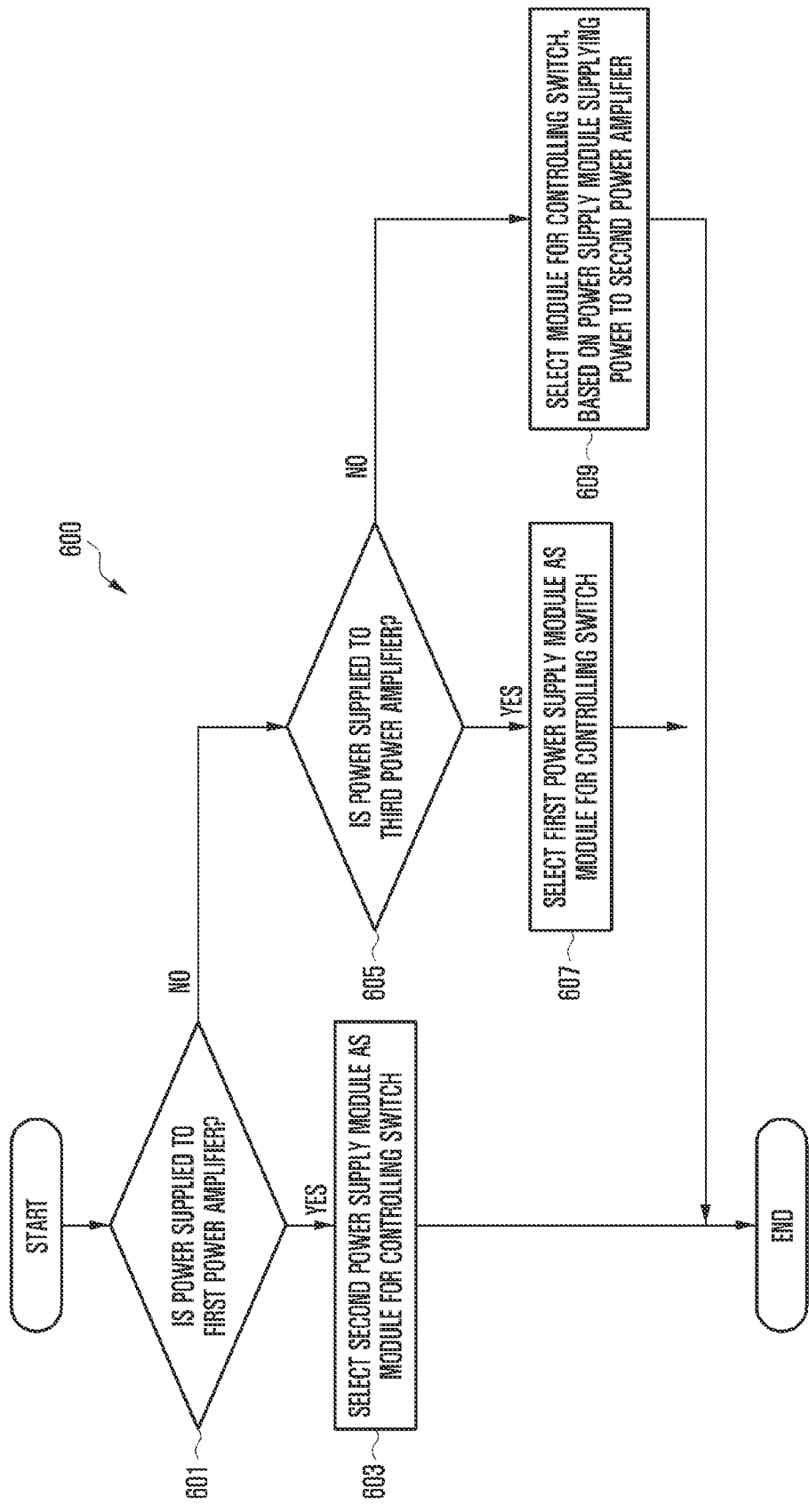

ELECTRONIC DEVICE INCLUDING A PLURALITY OF POWER AMPLIFIERS AND OPERATING METHOD THEREOF

CROSS-REFERENCE TO RELATED APPLICATIONS

This application is a continuation of International Application No. PCT/KR2022/004636 designating the United States, filed on Mar. 31, 2022, in the Korean Intellectual Property Receiving Office and claiming priority to Korean Patent Application No. 10-2021-0044994, filed on Apr. 7, 2021, in the Korean Intellectual Property Office, the disclosures of which are incorporated by reference herein in their entireties.

BACKGROUND

Field

The disclosure relates to a device and a method for supplying power to a plurality of power amplifiers in an electronic device.

Description of Related Art

With the development of information and communication technology and semiconductor technology, electronic devices may provide various functions. For example, an electronic device may provide a short-range wireless communication function (e.g., Bluetooth, wireless LAN, or near-field communication (NFC) and/or a mobile communication function (Long-Term Evolution (LTE), LTE-Advanced (LTE-A), or fifth-generation new radio (5G NR)).

An electronic device may generate a radio frequency (RF) signal for wireless communication. A circuit (e.g., a radio frequency front end (RFFE)) for processing an RF signal may occupy a certain physical area in the electronic device. The circuit (e.g., the RFFE) for processing the RF signal may require a greater physical area as the circuit has a more complicated structure.

The circuit for processing the RF signal may reduce the number of power suppliers included in the circuit for processing the RF signal to reduce the physical area occupied by the circuit for processing the RF signal or to minimize or reduce the complexity of the circuit. For example, a power amplifier included in the circuit for processing the RF signal operates based on power received from a power supplier and thus needs to be connected to the power supplier. In the circuit for processing the RF signal, at least one power supplier may be connected to a plurality of power amplifiers to selectively supply power through a structure in which output of the power supplier is switched, thereby reducing the number of power suppliers included in the circuit for processing the RF signal.

When the circuit for processing the RF signal supplies power to a plurality of power amplifiers through at least one power supply having an output switching structure, a plurality of power suppliers may be connected to one power amplifier. In the circuit for processing the RF signal, when outputs from a plurality of power suppliers are connected to one power amplifier due to malfunction of at least one power supplier and/or output control of at least one power supplier, damage may occur in the power suppliers and/or the power amplifier

SUMMARY

Embodiments of the disclosure disclose a device and a method for controlling power supply to a power amplifier in an electronic device.

According to various example embodiments, an electronic device may include: a first power amplifier, a second power amplifier, a third power amplifier, a first power supply module comprising a power supply configured to supply power to the first power amplifier or the second power amplifier, a second power supply module comprising a power supply configured to supply power to the second power amplifier or the third power amplifier, and a detection module comprising circuitry configured to identify a state of a connection between the second power amplifier and the first power supply module and a state of a connection between the second power amplifier and the second power supply module, wherein the detection module may be configured to output a power control signal based on detecting that the second power amplifier is connected to the first power supply module and the second power supply module, wherein power supply to the second power amplifier from the first power supply module or the second power supply module may be shut off based on the power control signal of the detection module.

According to various example embodiments, an electronic device may include: at least one antenna, a communication processor, and a wireless communication circuit electrically connected to the at least one antenna and the communication processor, wherein the wireless communication circuit may include: a first power amplifier configured to amplify a first signal provided from the communication processor and to output the first signal to the at least one antenna, a second power amplifier configured to amplify a second signal provided from the communication processor and to output the second signal to the at least one antenna, a third power amplifier configured to amplify a third signal provided from the communication processor and to output the third signal to the at least one antenna, a first power supply module including a power supply configured to supply power to the first power amplifier or the second power amplifier, a second power supply module including a power supply configured to supply power to the second power amplifier or the third power amplifier, and a detection module comprising circuitry configured to identify a state of a connection between the second power amplifier and the first power supply module and a state of a connection between the second power amplifier and the second power supply module, the detection module may be configured to output a power control signal based on detecting that the second power amplifier is connected to the first power supply module and the second power supply module, wherein power supply to the second power amplifier from the first power supply module or the second power supply module may be shut off based on the power control signal of the detection module.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 6 is a flowchart illustrating an example operation of selection of a power supply module for controlling power supply in an electronic device according to various embodiments.

DETAILED DESCRIPTION

Hereinafter, various example embodiments will be described in greater detail with reference to the figures.

Figure 1:
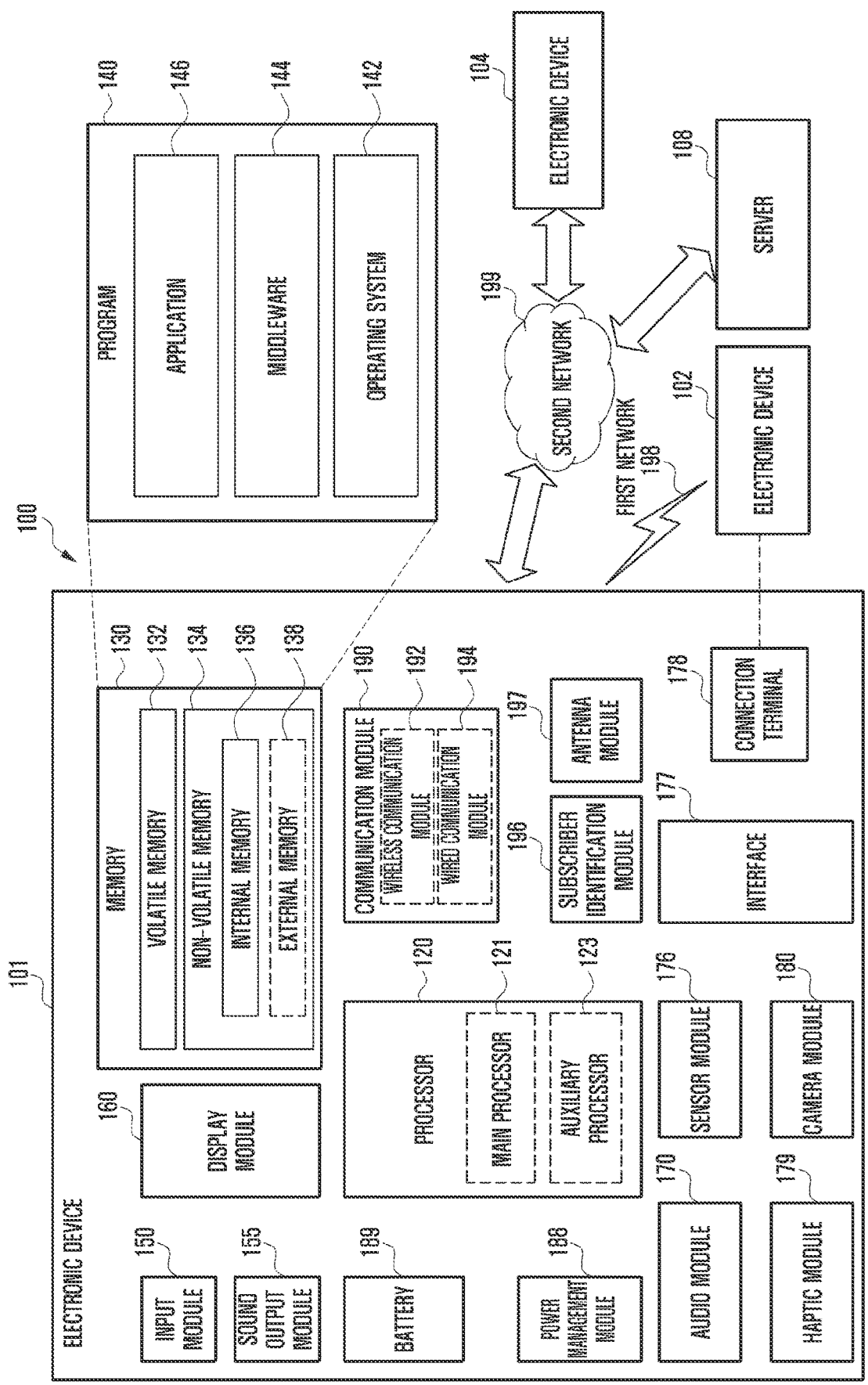
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC. According to an embodiment, the subscriber identification module 196 may include a plurality of subscriber identification modules. For example, the plurality of subscriber identification modules may store different subscriber information.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band. For example, the plurality of antennas may include patch array antennas and/or dipole array antennas. For example, the plurality of antennas may include a patch array antenna and/or a dipole array antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

In the following description, an electronic device may be configured in a structure of supplying power to three power amplifiers through two power supply modules having an output switching structure. However, the number of power supply modules and the number of power amplifiers are not limited to the foregoing numbers, and substantially the same operation may be performed even when a plurality of power supply modules is selectively connected to one power amplifier.

Figure 2:
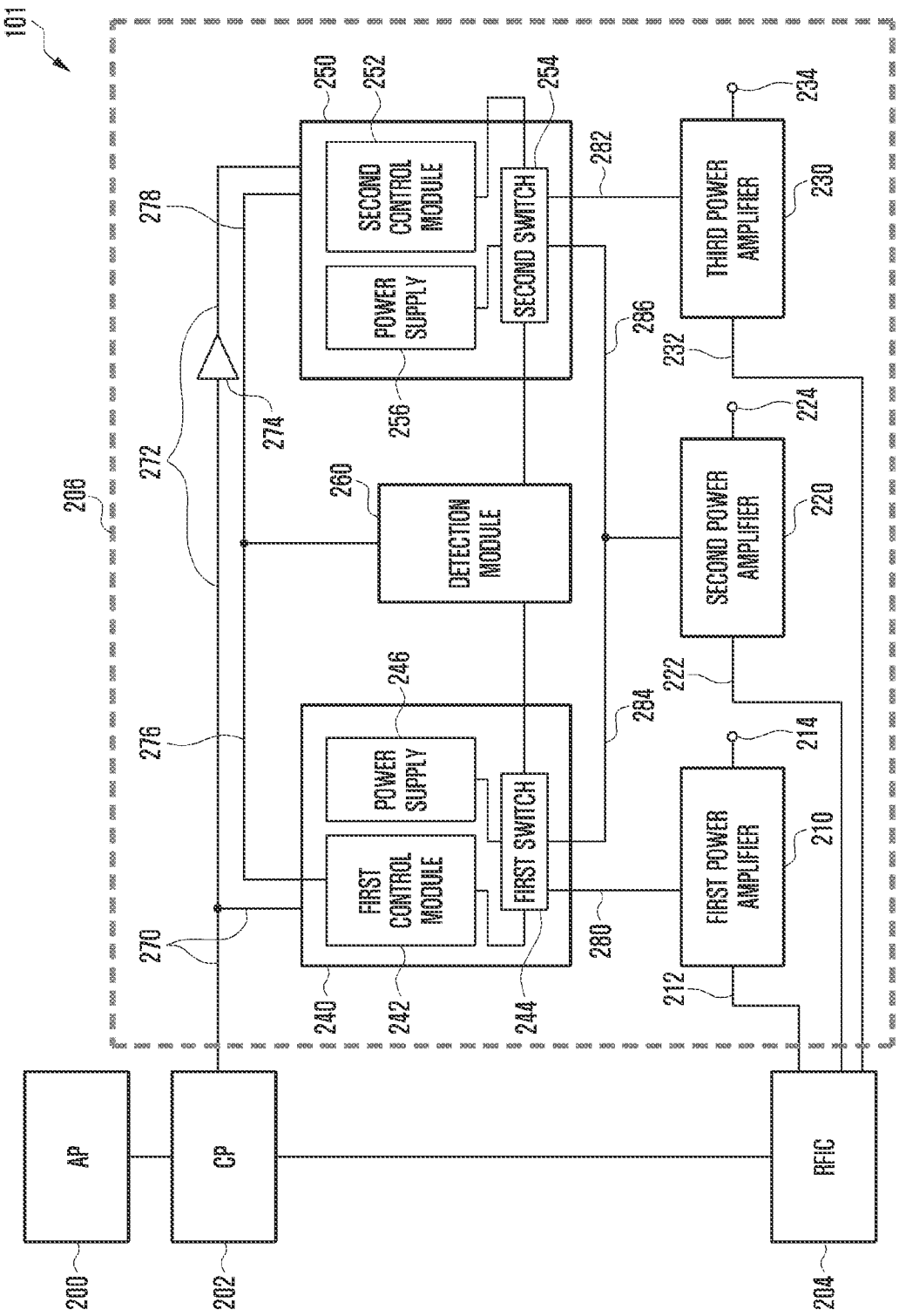
FIG. 2 is a block diagram illustrating an example configuration of an electronic device for power supply to a power amplifier according to various embodiments.

FIG. 2 is a block diagram illustrating an example configuration of an electronic device for supplying power to a power amplifier according to various embodiments.

According to various embodiments with reference to FIG. 2, an electronic device 101 may include an application processor (AP) (e.g., including processing circuitry) 200 (e.g., the processor 120 or the main processor 121 of FIG. 1), a communication processor (CP) (e.g., including processing circuitry)_202 (e.g., the processor 120 or the coprocessor 123 of FIG. 1), a radio frequency integrated circuit (RFIC) 204 (e.g., the wireless communication module 192 of FIG. 1), and/or a radio frequency front end (RFFE) 206 (e.g., the wireless communication module 192 of FIG. 1).

According to various embodiments, the application processor 200 may include various processing circuitry and control at least one different component (e.g., the communication processor 202) included in the electronic device 101 by performing various types of data processing or operations.

According to various embodiments, the communication processor 202 may include various processing circuitry and generate a baseband signal for wireless communication. According to an embodiment, the communication processor 202 may provide the baseband signal to the RFIC 204. According to an embodiment, the communication processor 202 may transmit the baseband signal to an intermediate frequency integrated circuit (IFIC) (not shown). The IFIC may upconvert the baseband signal received from the communication processor 202 into an intermediate frequency (IF) signal and may provide the IF signal to the RFIC 204.

According to various embodiments, the communication processor 202 may control a first power supply module 240 and/or a second power supply module 250 to supply power to a first power amplifier 210, a second power amplifier 220, and/or a third power amplifier 230. According to an embodiment, the communication processor 202 may control a first switch 244 of the first power supply module 240 so that power of the first power supply module 240 is supplied to the first power amplifier 210 or the second power amplifier 220. According to an embodiment, the communication processor 202 may control a second switch 254 of the second power supply module 250 so that power of the second power supply module 250 is supplied to the second power amplifier 220 or the third power amplifier 230. For example, the first switch 244 and/or the second switch 254 may include a single pole double throw (SPDT) switch.

According to various embodiments, the communication processor 202 may control the first power supply module 240 or the second power supply module 250 so that the power of the first power supply module 240 and the power of the second power supply module 250 are not supplied to the second power amplifier 220 in an at least partially overlapping manner. According to an embodiment, the communication processor 202 may select any one power supply module (e.g., the first power supply module 240 or the power of the second power supply module 250) for controlling shutoff of power supply to a power amplifier (e.g., the second power amplifier 220) from among the first power supply module 240 and the power of the second power supply module 250. For example, the power supply module for controlling the shutoff of power supply to the power amplifier (e.g., the second power amplifier 220) may be selected based on the power supply states of the first power supply module 240 and the second power supply module 250.

According to an embodiment, the communication processor 202 may provide a control signal indicating the power supply module for controlling the shutoff of power supply to the power amplifier (e.g., the second power amplifier 220) to the first power supply module 240 and/or the second power supply module 250.

According to an embodiment, when the first power supply module 240 is selected as the selected power supply module for controlling the shutoff of power supply to the second power amplifier 220, the communication processor 202 may output a control signal (e.g., 0 or about 0 V) indicating that the first power supply module 240 is selected as the power supply module for controlling the shutoff of power supply to the power amplifier (e.g., the second power amplifier 220). For example, the first power supply module 240 may receive the control signal (e.g., 0 or about 0 V) indicating that the first power supply module 240 is selected as the power supply module for controlling the shutoff of power supply through a fourth electrical path 270, thereby controlling power for driving the first switch 244 to be supplied or shut off to the first switch 244, based on a control signal provided from a detection module 260. In an example, when the power for driving the first switch 244 is supplied, the first power supply module 240 may supply the power to the first power amplifier 210 or the second power amplifier 220. In an example, when the power for driving the first switch 244 is shut off, the first power supply module 240 may shut off power supply to the first power amplifier 210 and the second power amplifier 220.

For example, the second power supply module 250 may receive a control signal (e.g., 1 or about 1.8 V) indicating that the second power supply module 250 is not selected as the power supply module for controlling the shutoff of power supply to the power amplifier (e.g., the second power amplifier 220), based on an inverter 274 disposed on a fifth electrical path 272, thereby controlling power for driving the second switch 254 to be continuously supplied to the second switch 254 regardless of the control single provided from the detection module 260. In this case, the second power supply module 250 may supply the power to the second power amplifier 220 or the third power amplifier 230. In an example, the control signal indicating that the second power supply module 250 is not selected may indicate that the first power supply module 240 is selected as the power supply module for controlling the shutoff of power supply.

According to an embodiment, when the second power supply module 250 is selected as the selected power supply module for controlling the shutoff of the power supply to the second power amplifier 220, the communication processor 202 may output a control signal (e.g., 1 or about 1.8 V) indicating that the first power supply module 240 is not selected as the power supply module for controlling the shutoff of power supply to the power amplifier (e.g., the second power amplifier 220). For example, the first power supply module 240 may receive the control signal (e.g., 1 or about 1.8 V) indicating that the first power supply module 240 is not selected as the power supply module for controlling the shutoff of power supply through the fourth electrical path 270, thereby controlling power for driving the first switch 244 to be continuously supplied to the first switch 244 regardless of a control single provided from the detection module 260. In this case, the first power supply module 240 may supply the power to the first power amplifier 210 or the second power amplifier 220. For example, the second power supply module 250 may receive a control signal (e.g., 0 or about 0 V) indicating that the second power supply module 250 is selected as the power supply module for controlling the shutoff of power supply to the power amplifier (e.g., the second power amplifier 220), based on the inverter 274 disposed on the fifth electrical path 272, thereby controlling power for driving the second switch 254 to be supplied or shut off to the second switch 254, based on the control single provided from the detection module 260. In an example, when the power for driving the second switch 254 is supplied, the second power supply module 250 may supply the power to the second power amplifier 220 or the third power amplifier 230. In an example, when the power for driving the second switch 254 is shut off, the second power supply module 250 may shut off power supply to the second power amplifier 220 and the third power amplifier 230. In an example, the control signal indicating that the second power supply module 250 is selected may indicate that the first power supply module 240 is not selected as the power supply module for controlling the shutoff of power supply.

According to various embodiments, the RFIC 204 may upconvert a signal provided from the communication processor 202 into an RF signal. According to an embodiment, the RFIC 204 may upconvert an IF signal provided from the IFIC (not shown) into an RF signal. According to an embodiment, the RFIC 204 may upconvert a baseband signal provided from the communication processor 202 into an RF signal.

According to various embodiments, the RFFE 206 may include the first power amplifier (PA) 210, the second power amplifier 220, the third power amplifier 230, the first power supply module 240, the second power supply module 250, and/or the detection module (e.g., including detection circuitry) 260.

According to various embodiments, the first power amplifier 210 may be connected to the RFIC 204, based on a first electrical path 212, may amplify a signal provided from the RFIC 204 through the first electrical path 212, and may output the signal through a first output port 214. According to an embodiment, the first power amplifier 210 may be connected to the first power supply module 240, based on an eighth electrical path 280, and may operate based on power provided from the first power supply module 240 through the eighth electrical path 280.

According to various embodiments, the second power amplifier 220 may be connected to the RFIC 204, based on a second electrical path 222, may amplify a signal provided from the RFIC 204 through the second electrical path 222, and may output the signal through a second output port 224. According to an embodiment, the second power amplifier 220 may be connected to the first power supply module 240, based on a tenth electrical path 284, and may be connected to the second power supply module 250, based on an eleventh electrical path 286. The second power amplifier 220 may operate based on power provided from the first power supply module 240 through the tenth electrical path 284 or power provided from the second power supply module 250 through the eleventh electrical path 286. According to an embodiment, at least part of the tenth electrical path 284 and at least part of the eleventh electrical path 286 may overlap.

According to various embodiments, the third power amplifier 230 may be connected to the RFIC 204, based on a third electrical path 232, may amplify a signal provided from the RFIC 204 through the third electrical path 232, and may output the signal through a third output port 234. According to an embodiment, the third power amplifier 230 may be connected to the second power supply module 250, based on a ninth electrical path 282, and may operate based on power provided from the second power supply module 250 through the ninth electrical path 282.

According to various embodiments, the first power amplifier 210, the second power amplifier 220, and/or the third power amplifier 230 may support different gains or may support the same gain. According to an embodiment, the first power amplifier 210, the second power amplifier 220, and/or the third power amplifier 230 may be electrically connected to at least one antenna. For example, the first output port 214 of the first power amplifier 210, the second output port 224 of the second power amplifier 220, and/or the third output port 234 of the third power amplifier 230 may be selectively connected to the same antenna. According to an embodiment, the first power amplifier 210, the second power amplifier 220, and/or the third power amplifier 230 may be connected to different antennas. For example, the first output port 214 of the first power amplifier 210 may be connected to a first antenna. The second output port 224 of the second power amplifier 220 may be connected to a second antenna. The third output port 234 of the third power amplifier 230 may be connected to a third antenna.

According to various embodiments, the first power supply module 240 may supply power to the first power amplifier 210 or the second power amplifier 220. According to an embodiment, the first power supply module 240 may supply power of a first power supply 246 to the first power amplifier 210 or the second power amplifier 220, based on control of the communication processor 202. For example, the first switch 244 of the first power supply module 240 may electrically connect the first power supply 246 to the first power amplifier 210 or the second power amplifier 220, based on control of the communication processor 202. For example, when power (e.g., VDD_SW) for driving the first switch 244 is provided through a first control module (e.g., including various control circuitry) 242, the first switch 244 may electrically connect the first power supply 246 to the first power amplifier 210 or the second power amplifier 220. In another example, when the power (e.g., VDD_SW) for driving the first switch 244 is shut off by the first control module 242, the first switch 244 may electrically disconnect the first power supply 246 from the first power amplifier 210 and the second power amplifier 220.

According to an embodiment, the first control module 242 may be connected to the communication processor 202 through the fourth electrical path 270, and may be connected to the detection module 260 through a sixth electrical path 276. The first control module 242 may include various control circuitry and control the power for driving the first switch 244 to be supplied or shut off to the first switch 244, based on a control signal related to shutoff of power supply to a power amplifier (e.g., the second power amplifier 220) provided from the communication processor 202 through the fourth electrical path 270 and/or a control signal provided from the detection module 260 through the sixth electrical path 276. For example, when receiving a control signal indicating that the first power supply module 240 is not selected as a power supply module for controlling the shutoff of power supply to the power amplifier (e.g., the second power amplifier 220) from the communication processor 202 through the fourth electrical path 270, the first control module 242 may provide the power (e.g., VDD_SW) for driving the first switch 244 to the first switch 244 regardless of the control signal provided from the detection module 260. In this case, the first switch 244 may electrically connect the first power supply 246 to the first power amplifier 210 or the second power amplifier 220. In another example, when receiving a control signal indicating that the first power supply module 240 is selected as the power supply module for controlling the shutoff of power supply to the power amplifier (e.g., the second power amplifier 220) from the communication processor 202 through the fourth electrical path 270, the first control module 242 may selectively provide the power (e.g., VDD_SW) for driving the first switch 244 to the first switch 244, based on the control signal provided from the detection module 260. For example, when receiving a control signal indicating that the first power supply module 240 and the second power supply module 250 are not simultaneously connected to the second power amplifier 220 from the detection module 260 through the sixth electrical signal 276, the first control module 242 may provide the power (e.g., VDD_SW) for driving the first switch 244 to the first switch 244. In another example, when receiving a control signal indicating that the first power supply module 240 and the second power supply module 250 are connected to the second power amplifier 220 in an at least partly overlapping manner from the detection module 260 through the sixth electrical signal 276, the first control module 242 may shut off the power (e.g., VDD_SW) for driving the first switch 244.

According to various embodiments, the second power supply module 250 may supply power to the second power amplifier 220 or the third power amplifier 230. According to an embodiment, the second power supply module 250 may supply power of a second power supply 256 to the second power amplifier 220 or the third power amplifier 230, based on control of the communication processor 202. For example, the second switch 254 of the second power supply module 250 may electrically connect the second power supply 256 to the second power amplifier 220 or the third power amplifier 230, based on control of the communication processor 202. For example, when power (e.g., VDD_SW) for driving the second switch 254 is provided through a second control module (e.g., including various control circuitry) 252, the second switch 254 may electrically connect the second power supply 266 to the second power amplifier 220 or the third power amplifier 230. In another example, when the power (e.g., VDD_SW) for driving the second switch 254 is shut off by the second control module 252, the second switch 254 may electrically disconnect the second power supply 256 from the second power amplifier 220 and the third power amplifier 230.

According to an embodiment, the second control module 252 may be connected to the communication processor 202 through the fifth electrical path 272 diverging from the fourth electrical path 270, and may be connected to the detection module 260 through a seventh electrical path 278. The second control module 252 may control the power for driving the second switch 254 to be supplied or shut off to the second switch 254, based on a control signal related to shutoff of power supply provided from the communication processor 202 through the fifth electrical path 272 and/or a control signal provided from the detection module 260 through the seventh electrical path 278. For example, when receiving a control signal indicating that the second power supply module 250 is not selected as a power supply module for controlling the shutoff of power supply to the power amplifier (e.g., the second power amplifier 220) from the communication processor 202 through the fifth electrical path 272, the second control module 252 may provide the power (e.g., VDD_SW) for driving the second switch 254 to the second switch 254 regardless of the control signal provided from the detection module 260. In this case, the second switch 254 may electrically connect the second power supply 256 to the second power amplifier 220 or the third power amplifier 230. In another example, when receiving a control signal indicating that the second power supply module 250 is selected as the power supply module for controlling the shutoff of power supply to the power amplifier (e.g., the second power amplifier 220) from the communication processor 202 through the fifth electrical path 272, the second control module 252 may selectively provide the power (e.g., VDD_SW) for driving the second switch 254 to the second switch 254, based on the control signal provided from the detection module 260. For example, when receiving a control signal indicating that the first power supply module 240 and the second power supply module 250 are not simultaneously connected to the second power amplifier 220 from the detection module 260 through the seventh electrical signal 278, the second control module 252 may provide the power (e.g., VDD_SW) for driving the second switch 254 to the second switch 254. In another example, when receiving a control signal indicating that the first power supply module 240 and the second power supply module 250 are connected to the second power amplifier 220 in an at least partly overlapping manner from the detection module 260 through the seventh electrical signal 278, the second control module 252 may shut off the power (e.g., VDD_SW) for driving the second switch 254.

According to various embodiments, the detection module 260 may include various detection circuitry and identify a state of a connection between the first power supply module 240 and the second power amplifier 220 and a state of a connection between the second power supply module 250 and the second power amplifier 220. According to an embodiment, the detection module 260 may identify (or predict) the state of the connection between the first power supply module 240 and the second power amplifier 220, based on a control signal of the first switch 244 by the communication processor 202. For example, the control signal of the first switch 244 may include a control signal indicating that the first power supply 246 is electrically connected to the first power amplifier 210 or the second power amplifier 220.

According to an embodiment, the detection module 260 may identify (or predict) the state of the connection between the second power supply module 250 and the second power amplifier 220, based on a control signal of the second switch 254 by the communication processor 202. For example, the control signal of the second switch 254 may include a control signal indicating that the second power supply 256 is electrically connected to the second power amplifier 220 or the third power amplifier 230.

According to an embodiment, when determining (or predicting) that the second power amplifier 220 is not connected to the first power supply module 240 and the second power supply module 250, the detection module 260 may output a control signal indicating that the first power supply module 240 and the second power supply module 250 are not simultaneously connected to the second power amplifier 220 to the first power supply module 240 and/or the second power supply. module 250.

According to an embodiment, when determining (or predicting) that the second power amplifier 220 is connected to either the first power supply module 240 or the second power supply module 250, the detection module 260 may output a control signal indicating that the first power supply module 240 and the second power supply module 250 are not simultaneously connected to the second power amplifier 220 to the first power supply module 240 and/or the second power supply module 250.

According to an embodiment, when determining (or predicting) that the second power amplifier 220 is connected to the first power supply module 240 and the second power supply module 250, the detection module 260 may output a control signal indicating that the first power supply module 240 and the second power supply module 250 are connected to the second power amplifier 220 in an at least partly overlapping manner to the first power supply module 240 and/or the second power supply module 250.

According to various embodiments, the RFFE, 206 may shut off power supply of the first power supply module 240 or the second power supply module 250, based on a control signal provided from the detection module 260. According to an embodiment, when the first power supply module 240 and the second power supply module 250 are connected to the second power amplifier 220 in an at least partly overlapping manner, the second power amplifier 220 may shut off the power supply from the first power supply module 240 or the second power supply module 250.

Figure 3:
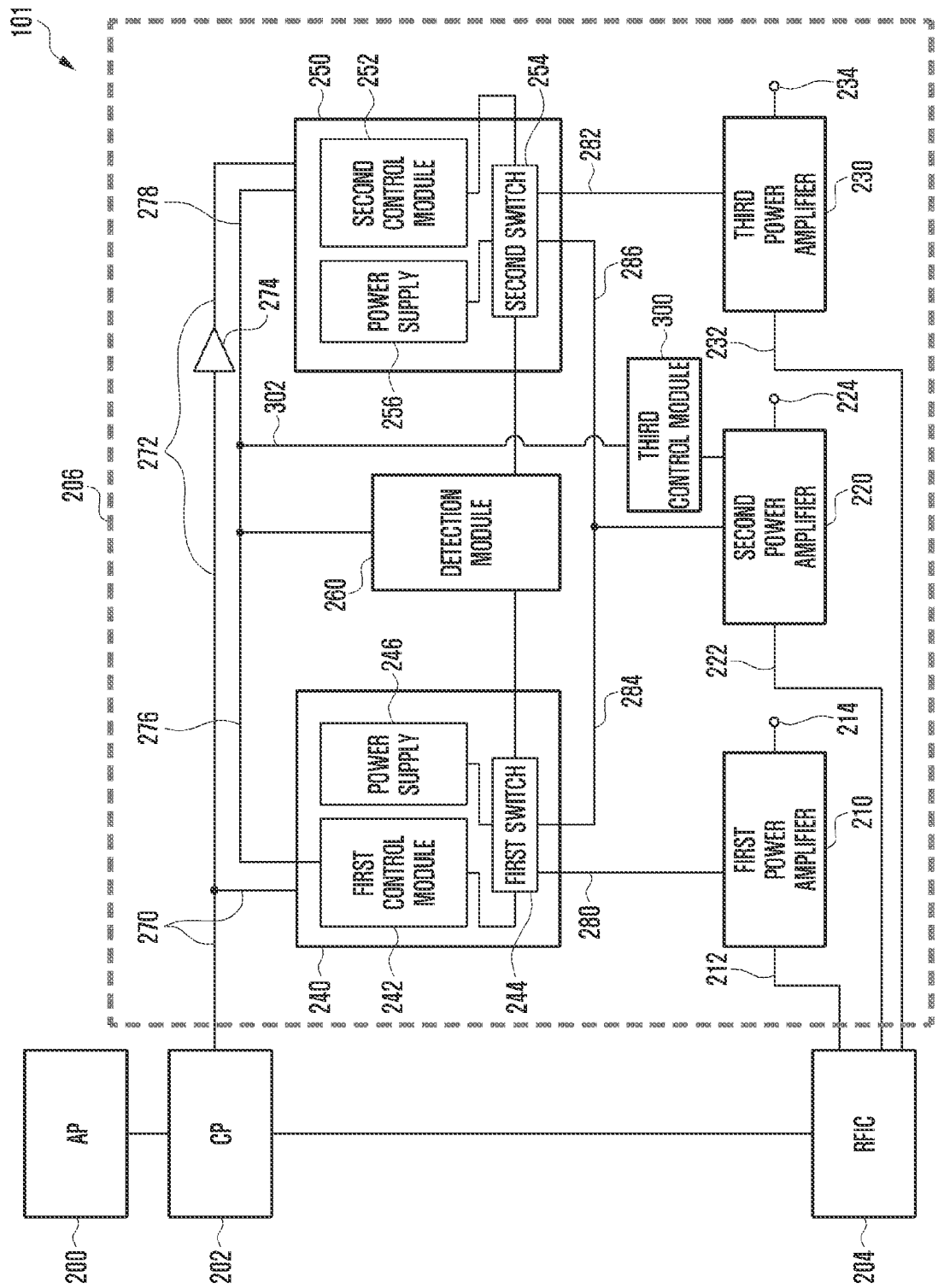
FIG. 3 is a block diagram illustrating an example configuration of an electronic device for controlling driving of a power amplifier according to various embodiments.

FIG. 3 is a block diagram illustrating an example configuration of an electronic device for controlling driving of a power amplifier according to various embodiments.

According to various embodiments with reference to FIG. 3, the electronic device 101 may include an application processor (AP) (e.g., including processing circuitry) 200 (e.g., the processor 120 or the main processor 121 of FIG. 1), a communication processor (CP) (e.g., including processing circuitry) 202 (e.g., the processor 120 or the coprocessor 123 of FIG. 1), a radio frequency integrated circuit (RFIC) 204 (e.g., the wireless communication module 192 of FIG. 1), and/or a radio frequency front end (RFFE) 206 (e.g., the wireless communication module 192 of FIG. 1). For example, the application processor 200, the communication processor 202, and the RFIC 204 of FIG. 3 may operate similarly to the application processor 200, the communication processor 202, and the RFIC 204 of FIG. 2. Accordingly, to avoid a description overlapping with that of FIG. 2, a detailed description of the application processor 200, the communication processor 202, and the RFIC 204 of FIG. 3 may not be repeated.

According to various embodiments, the RFFE, 206 may include a first power amplifier (PA) 210, a second power amplifier 220, a third power amplifier 230, a first power supply module 240, a second power supply module 250, a detection module 260, and/or a third control module (e.g., including various control circuitry) 300. According to an embodiment, in the RFFE 206 of FIG. 3, the first power amplifier 210, the second power amplifier 220, the third power amplifier 230, the first power supply module 240, the second power supply module 250, and the detection module 260 excluding the third control module 300 may operate similarly to the first power amplifier 210, the second power amplifier 220, the third power amplifier 230, the first power supply module 240, the second power supply module 250, and the detection module 260 of FIG. 2. Accordingly, to avoid a description overlapping with that of FIG. 2, a detailed description of the first power amplifier 210, the second power amplifier 220, the third power amplifier 230, the first power supply module 240, the second power supply module 250, and the detection module 260 of FIG. 3 may not be repeated.

According to various embodiments, the third control module 300 may include various control circuitry and control supply of a bias current related to driving of the second power amplifier 220. According to an embodiment, the third control module 300 may be electrically connected to the detection module 260, based on a twelfth electrical path 302 diverging from a seventh electrical path 278 (or a sixth electrical path 276).

According to an embodiment, when a control signal indicating that the first power supply module 240 and the second power supply module 250 are not simultaneously connected to the second power amplifier 220 is received from the detection module 260 through the twelfth electrical path 302, the third control module 300 may supply the bias current to the second power amplifier 220. For example, when the bias current is supplied based on the third control module 300, the second power amplifier 220 may amplify a signal provided from the RFIC 204 through a second electrical path 222 and may output the signal through a second output port 224.

According to an embodiment, when a control signal indicating that the first power supply module 240 and the second power supply module 250 are connected to the second power amplifier 220 in an at least partly overlapping manner is received from the detection module 260 through the twelfth electrical path 302, the third control module 300 may shut off supply of the bias current to the second power amplifier 220. For example, when the supply of the bias current is shut off based on the third control module 300, driving of the second power amplifier 220 may be restricted.

Figure 4:
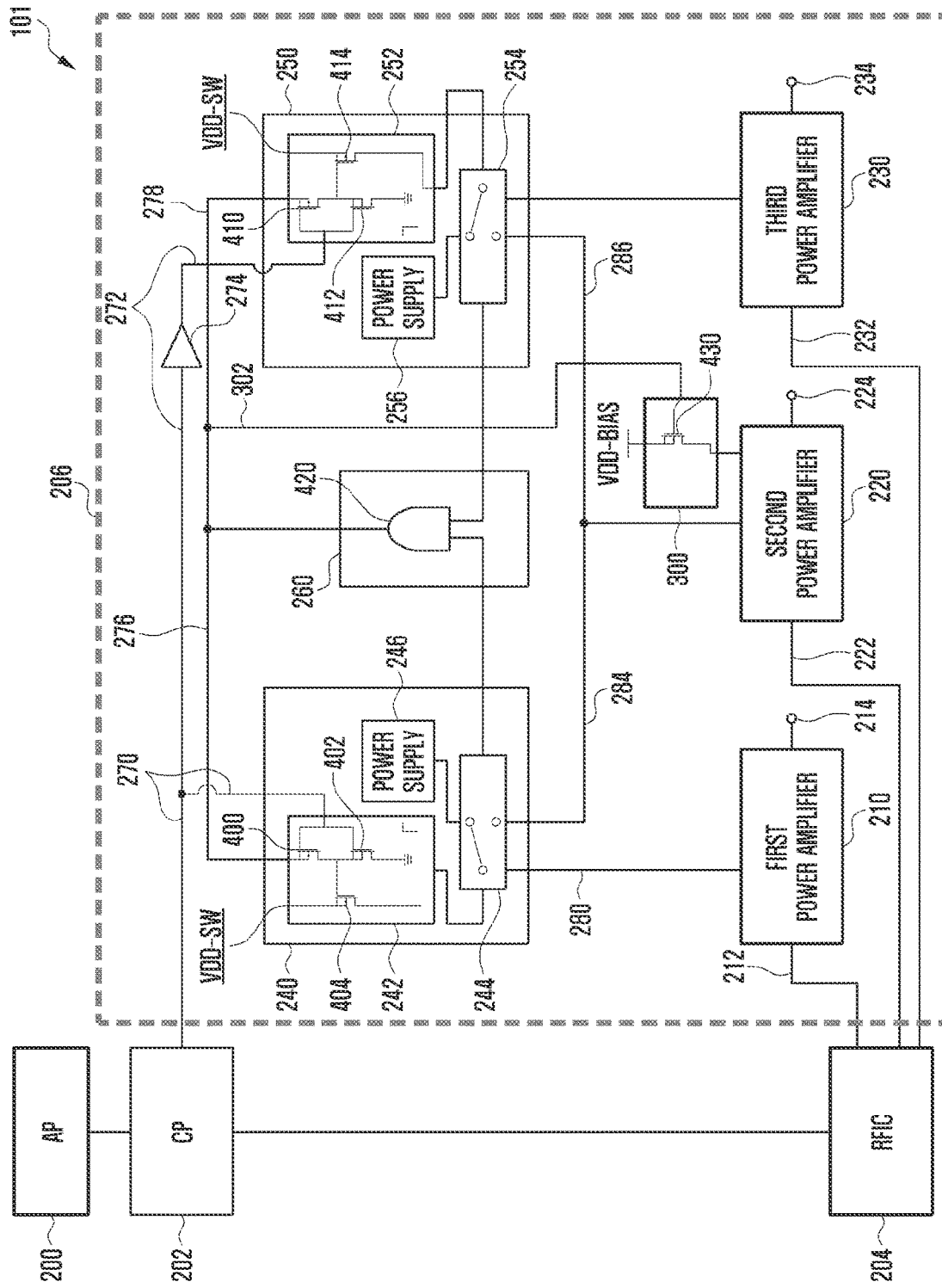
FIG. 4 is a block diagram illustrating an example configuration of a power supply module for controlling power supply to a power amplifier according to various embodiments.

FIG. 4 is a block diagram illustrating an example configuration of a power supply module for controlling power supply to a power amplifier according to various embodiments.

According to various embodiments with reference to FIG. 4, a first control module 242 may include a first transistor 400 (e.g., a PMOS type), a second transistor 402 (e.g., an NMOS type), and/or a third transistor 404 (e.g., a PMOS type). For example, the first control module 242 may include the first transistor 400, the second transistor 402, and/or the third transistor 404 formed in a push-pull structure.

According to an embodiment, when receiving a control signal (e.g., 1 or about 1.8 V) indicating that the power supply module is not selected as a power supply module for controlling shutoff of power supply to a power amplifier (e.g., a second power amplifier 220) from a communication processor 202 through a fourth electrical path 270, the first transistor 400 of the first control module 242 may be deactivated (e.g., OFF). For example, the first transistor 400 may operate in an inactive state regardless of a control signal provided from a detection module 260.

According to an embodiment, when receiving the control signal (e.g., 1 or about 1.8 V) indicating that the power supply module is not selected as the power supply module for controlling the shutoff of power supply to the power amplifier (e.g., the second power amplifier 220) from the communication processor 202 through the fourth electrical path 270, the second transistor 402 may be activated (e.g., ON). For example, the second transistor 402 may operate in an active state regardless of the control signal provided from the detection module 260.

According to an embodiment, the third transistor 404 may maintain an active (e.g., ON) state when the first transistor 400 is deactivated and the second transistor 402 is activated. When the third transistor 404 maintains the active state, power (e.g., VDD_SW) for driving a first switch 244 may be continuously supplied to the first switch 244.

According to various embodiments, a second control module 252 may include a fourth transistor 410 (e.g., a PMOS type), a fifth transistor 412 (e.g., an NMOS type), and/or a sixth transistor 414 (e.g., a PMOS type). For example, the second control module 252 may include the fourth transistor 410, the fifth transistor 412, and/or the sixth transistor 414 formed in a push-pull structure.

According to an embodiment, when receiving a control signal (e.g., 0 or about 0 V) indicating that the power supply module is selected as the power supply module for controlling the shutoff of power supply to the power amplifier (e.g., the second power amplifier 220) from the communication processor 202 through a fifth electrical path 272, the fifth transistor 412 of the second control module 252 may be deactivated (e.g., OFF). For example, the fifth transistor 412 may operate in an inactive state regardless of a control signal provided from the detection module 260.

According to an embodiment, when receiving the control signal (e.g., 0 or about 0 V) indicating that the power supply module is selected as the power supply module for controlling the shutoff of power supply to the power amplifier (e.g., the second power amplifier 220) from the communication processor 202 through the fifth electrical path 272, the fourth transistor 410 may activate or deactivate the sixth transistor 414, based on the control signal provided from the detection module 260. For example, when receiving a control signal (e.g., 0) indicating that the first power supply module 240 and the second power supply module 250 are not simultaneously connected to the second power amplifier 220 from the detection module 260 through a seventh electrical path 278, the fourth transistor 410 may activate the sixth transistor 414. In another example, when receiving a control signal (e.g., 1) indicating that the first power supply module 240 and the second power supply module 250 are connected to the second power amplifier 220 in an at least partly overlapping manner from the detection module 260 through the seventh electrical path 278, the fourth transistor 410 may deactivate the sixth transistor 414.

According to an embodiment, when an operation state of the fourth transistor 410 is an active state, the sixth transistor 414 may be activated or deactivated based on a control signal received from the detection module 260 through the seventh electrical path 278. For example, when the fourth transistor 410 is in the active state and the control signal indicating that the first power supply module 240 and the second power supply module 250 are not simultaneously connected to the second power amplifier 220 is received from the detection module 260 through the seventh electrical path 278, the sixth transistor 414 may be activated. For example, when the sixth transistor 414 is activated, power (e.g., VDD_SW) for driving a second switch 254 may be supplied to the second switch 254. In another example, when the fourth transistor 410 is in the active state and the control signal indicating that the first power supply module 240 and the second power supply module 250 are connected to the second power amplifier 220 in the at least partly overlapping manner is received from the detection module 260 through the seventh electrical path 278, the sixth transistor 414 may be deactivated. For example, when the sixth transistor 414 is deactivated, the power (e.g., VDD_SW) for driving the second switch 254 may be short off. For example, when the power (e.g., VDD_SW) for driving the second switch 254 is shut off by the second control module 252, the second switch 254 may disconnect a second power supply 256 from the second power amplifier 220 and a third power amplifier 230.

According to various embodiments, a third control module 300 may include a seventh transistor 430 (e.g., a PMOS type). According to an embodiment, when receiving a control signal (e.g., 0) indicating that the first power supply module 240 and the second power supply module 250 are not simultaneously connected to the second power amplifier 220 from the detection module 260 through a twelfth electrical path 302, the seventh transistor 430 of the third control module 252 may be activated. According to an embodiment, when receiving a control signal (e.g., 1) indicating that the first power supply module 240 and the second power supply module 250 are connected to the second power amplifier 220 in an at least partly overlapping manner from the detection module 260 through the twelfth electrical path 302, the seventh transistor 430 may be deactivated.

According to various embodiments, when the seventh transistor 430 is in an active state, a bias current may be supplied to the second power amplifier 220. For example, when the bias current is supplied based on the third control module 300, the second power amplifier 220 may amplify a signal provided from an RFIC 204 through a second electrical path 222 and may output the signal through a second output port 224.

According to various embodiments, when the seventh transistor 430 is in an inactive state, supply of the bias current to the second power amplifier 220 may be shut off. For example, when the supply of the bias current is shut off based on the third control module 300, driving of the second power amplifier 220 may be restricted (e.g., OFF).

According to various embodiments, the detection module 260 may include an AND gate 420. According to an embodiment, the detection module 260 may identify (or predict) a state of a connection between a first power supply 246 and the second power amplifier 220, based on a control signal of the first switch 244 by the communication processor 202. For example, when indicating a connection between the first power supply 246 and a first power amplifier 210, the control signal of the first switch 244 may be configured to "0". When indicating the connection between the first power supply 246 and the second power amplifier 220, the control signal of the first switch 244 may be configured to "1". According to an embodiment, the detection module 260 may identify (or predict) a state of a connection between the second power supply 256 and the second power amplifier 220, based on a control signal of the second switch 254 by the communication processor 202. For example, when indicating a connection between the second power supply 256 and a third power amplifier 230, the control signal of the second switch 254 may be configured to "0". When indicating the connection between the second power supply 256 and the second power amplifier 220, the control signal of the second switch 254 may be configured to "1".

According to an embodiment, as illustrated in Table 1, when the first power supply 246 and the second power supply 256 are electrically connected to the second power amplifier 220, the detection module 260 may output "1". For example, when receiving a signal of "1" from the detection module 260, the first control module 242 or the second control module 252 may restrict driving of the first switch 244 or the second switch 254. For example, when receiving the signal of "1" from the detection module 260, the third control module 300 may shut off the supply of the bias current to the second power amplifier 220.

TABLE 1

| First switch control signal | Second switch control signal | Output from detection module | Power supply module | Third control module |
|---|---|---|---|---|
| 0 | 0 | 0 | ON | ON |
| 0 | 1 | 0 | ON | ON |
| 1 | 0 | 0 | ON | ON |
| 1 | 1 | 1 | OFF | OFF |

Figure 5:
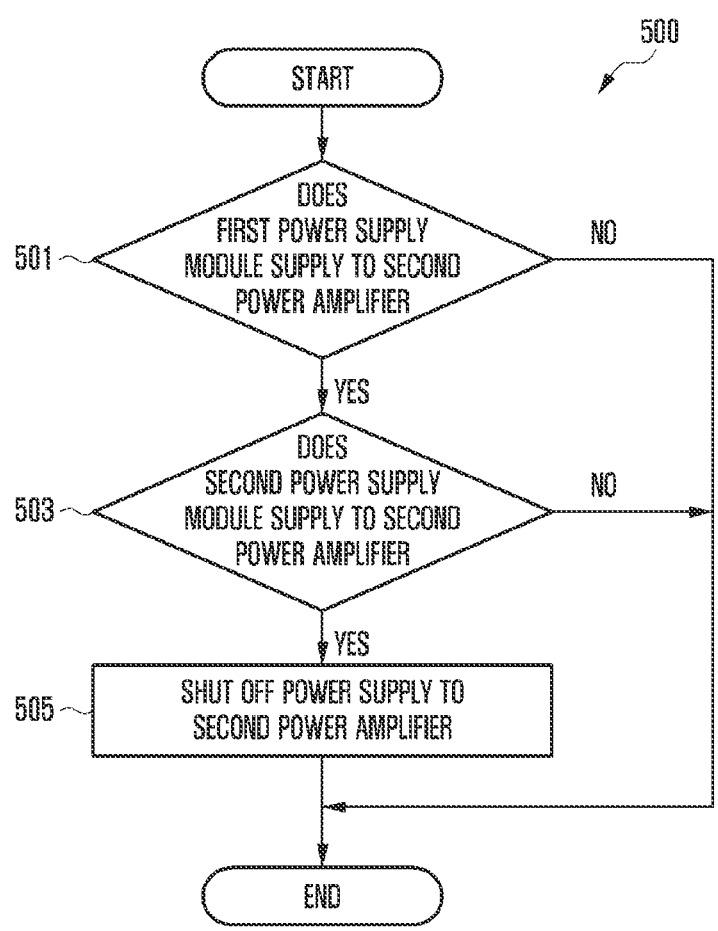
FIG. 5 is a flowchart illustrating an example operation of supplying power to a power amplifier in an electronic device according to various embodiments.

FIG. 5 is a flowchart 500 illustrating an example method of supplying power to a power amplifier in an electronic device according to various embodiments. In the following example embodiments, operations may be sequentially performed but are not necessarily sequentially performed. For example, the order of the operations may be changed, and at least two operations may be performed in parallel. In an example, the electronic device of FIG. 5 may include the electronic device 101 of FIG. 1, FIG. 2, FIG. 3, or FIG. 4.

According to various embodiments with reference to FIG. 5, in operation 501, the electronic device (e.g., the processor 120 of FIG. 1 or the communication processor 202 of FIG. 3) may identify whether a first power supply module 240 supplies power to a second power amplifier 220.

According to various embodiments, when the first power supply module 240 does not supply power to the second power amplifier 220 (e.g., No in operation 501), the electronic device (e.g., the processor 120 or 202) may terminate the operation. According to an embodiment, when the first power supply module 240 does not supply power to the second power amplifier 220, a communication processor 202 may determine that power of the first power supply module 240 and power of a second power supply module 250 are not supplied to the second power amplifier 220 in an at least partly overlapping manner. Accordingly, the communication processor 202 may terminate the power supply to the power amplifier.

According to various embodiments, when the first power supply module 240 supplies power to the second power amplifier 220 (e.g., Yes in operation 501), the electronic device (e.g., the processor 120 or 202) may identify whether the second power supply module 250 supplies power to the second power amplifier 220 in operation 503.

According to various embodiments, when the second power supply module 250 does not supply power to the second power amplifier 220 (e.g., No in operation 503), the electronic device (e.g., the processor 120 or 202) may terminate supply to the second power amplifier. According to an embodiment, when the second power supply module 250 does not supply power to the second power amplifier 220, the communication processor 202 may determine that the power of the first power supply module 240 and the power of a second power supply module 250 are not supplied to the second power amplifier 220 in an at least partly overlapping manner. Accordingly, the communication processor 202 may terminate the power supply to the power amplifier.

According to various embodiments, when the second power supply module 250 supplies power to the second power amplifier 220 (e.g., Yes in operation 503), the electronic device (e.g., the processor 120 or 202) may shut off power supply from any one of the first power supply module 240 and the second power supply module 250 to the second power amplifier 220 in operation 505.

FIG. 6 is a flowchart 600 illustrating an example operation of selection of a power supply module for controlling power supply in an electronic device according to various embodiments. According to an embodiment, operations of FIG. 6 may be specific operations of operation 505 of FIG. 5. In the following embodiments, the operations may be sequentially performed but are not necessarily sequentially performed. For example, the order of the operations may be changed, and at least two operations may be performed in parallel. In an example, the electronic device of FIG. 6 may include the electronic device 101 of FIG. 1, FIG. 2, FIG. 3, or FIG. 4.

According to various embodiments with reference to FIG. 6, in operation 601, the electronic device (e.g., the processor 120 of FIG. 1 or the communication processor 202 of FIG. 3) may identify whether power is supplied to a first power amplifier 210.

According to various embodiments, when power is supplied to the first power amplifier 210 (e.g., Yes in operation 601), the electronic device (e.g., the processor 120 or 202) may select a second power supply module 250 as a power supply module for controlling shutoff of power supply to a second power amplifier 220 in operation 603. According to an embodiment, when it is determined that a first power supply module 240 supplies power to the first power amplifier 210, a communication processor 202 may select the second power supply module 250 as the power supply module for controlling the shutoff of power supply to the second power amplifier 220. For example, the communication processor 202 may output a control signal (e.g., 1 or about 1.8 V) indicating that the first power supply module 240 is not selected as a power supply module for controlling shutoff of power supply to a power amplifier (e.g., the second power amplifier 220). For example, when the communication processor 202 may output the control signal indicating that the first power supply module 240 is not selected as the power supply module for controlling the shutoff of power supply to the power amplifier (e.g., the second power amplifier 220), the second power supply module 250 may receive a control signal (e.g., 0 or about 0 V) indicating that the second power supply module 250 is selected as the power supply module for controlling the shutoff of power supply to the power amplifier (e.g., the second power amplifier 220), based on an inverter 274 disposed on a fifth electrical path 272. When receiving the control signal indicating that the second power supply module 250 is selected as the power supply module for controlling the shutoff of power supply to the power amplifier (e.g., the second power amplifier 220), the second power supply module 250 may control power for driving a second switch 254 to be supplied or shut off to the second switch 254, based on a control single provided from a detection module 260. In an example, when receiving a control signal indicating that the first power supply module 240 and the second power supply module 250 are not simultaneously connected to the second power amplifier 220 from the detection module 260, the second power supply module 250 may supply the power for driving the second switch 254 to the second switch 254. In another example, when receiving a control signal indicating that the first power supply module 240 and the second power supply module 250 are connected to the second power amplifier 220 in an at least partly overlapping manner from the detection module 260, the second power supply module 250 may shut off the power for driving the second switch 254 not to be supplied to the second switch 254. For example, when receiving a control signal indicating that the first power supply module 240 is not selected as the power supply module for controlling the shutoff of power supply to the power amplifier (e.g., the second power amplifier 220) from the communication processor 202, the first power supply module 240 may continuously supply power for driving a first switch 244 to the first switch 244 regardless of a control signal provided from the detection module 260.

According to various embodiments, when power is not supplied to the first power amplifier 210 (e.g., No in operation 601), the electronic device (e.g., the processor 120 or 202) may identify whether power is supplied to a third power amplifier 230 in operation 605.

According to various embodiments, when power is supplied to the third power amplifier 230 (e.g., Yes in operation 605), the electronic device (e.g., the processor 120 or 202) may select the first power supply module 240 as the power supply module for controlling the shutoff of power supply to the second power amplifier 220 in operation 607. According to an embodiment, when it is determined that the second power supply module 250 supplies power to the third power amplifier 230, the communication processor 202 may select the first power supply module 240 as the power supply module for controlling the shutoff of power supply to the second power amplifier 220. For example, the communication processor 202 may output a control signal (e.g., 0 or about 0 V) indicating that the first power supply module 240 is selected as the power supply module for controlling the shutoff of power supply to the power amplifier (e.g., the second power amplifier 220). For example, when receiving the control signal indicating that the first power supply module 240 is selected as the power supply module for controlling the shutoff of power supply to the power amplifier (e.g., the second power amplifier 220) from the communication processor 202, the first power supply module 240 may control the power for driving the first switch 244 to be supplied or shut off to the first switch 244, based on a control single provided from the detection module 260. In an example, when receiving a control signal indicating that the first power supply module 240 and the second power supply module 250 are not simultaneously connected to the second power amplifier 220 from the detection module 260, the first power supply module 240 may supply the power for driving the first switch 244 to the first switch 244. In another example, when receiving a control signal indicating that the first power supply module 240 and the second power supply module 250 are connected to the second power amplifier 220 in an at least partly overlapping manner from the detection module 260, the first power supply module 240 may shut off the power for driving the first switch 244 not to be supplied to the first switch 244. For example, when the communication processor 202 outputs the control signal indicating that the first power supply module 240 is selected as the power supply module for controlling the shutoff of power supply to the power amplifier (e.g., the second power amplifier 220), the second power supply module 250 may receive a control signal indicating that the second power supply module 250 is not selected as the power supply module for controlling the shutoff of power supply to the power amplifier (e.g., the second power amplifier 220), based on the inverter 274 disposed on the fifth electrical path 272. When receiving the control signal indicating that the second power supply module 250 is not selected as the power supply module for controlling the shutoff of power supply to the power amplifier (e.g., the second power amplifier 220), the second power supply module 250 may continuously supply the power for driving the second switch 254 to the second switch 254 regardless of a control signal provided from the detection module 260.

According to various embodiments, when power is not supplied to the third power amplifier 230 (e.g., No in operation 605), the electronic device (e.g., the processor 120 or 202) may select a power supply module for controlling power supply to the second power amplifier 220, based on a power supply module that is supplying power to the second power amplifier 220 in operation 609.

According to an embodiment, when it is identified that the first power supply module 240 supplies power to the second power amplifier 220, the communication processor 202 may select the second power supply module 250 as a power supply module for controlling shutoff of power supply to the second power amplifier 220. For example, the communication processor 202 may output a control signal (e.g., 1 or about 1.8 V) indicating that the first power supply module 240 is not selected as the power supply module for controlling the shutoff of power supply to the power amplifier (e.g., the second power amplifier 220).

According to an embodiment, when it is identified that the second power supply module 250 supplies power to the second power amplifier 220, the communication processor 202 may select the first power supply module 240 as a power supply module for controlling shutoff of power supply to the second power amplifier 220. For example, the communication processor 202 may output a control signal (e.g., 0 or about 0 V) indicating that the first power supply module 240 is selected as the power supply module for controlling the shutoff of power supply to the power amplifier (e.g., the second power amplifier 220).

According to various example embodiments, an electronic device (e.g., the electronic device 101 of FIG. 1, FIG. 2, FIG. 3, or FIG. 4) may include a first power amplifier (e.g., the first power amplifier 210 of FIG. 2, FIG. 3, or FIG. 4), a second power amplifier (e.g., the second power amplifier 220 of FIG. 2, FIG. 3, or FIG. 4), a third power amplifier (e.g., the third power amplifier 230 of FIG. 2, FIG. 3, or FIG. 4), a first power supply module including a power supply (e.g., the first power supply module 240 of FIG. 2, FIG. 3, or FIG. 4) configured to supply power to the first power amplifier or the second power amplifier, a second power supply module including a power supply (e.g., the second power supply module 250 of FIG. 2, FIG. 3, or FIG. 4) configured to supply power to the second power amplifier or the third power amplifier, and a detection module including circuitry (e.g., the detection module 260 of FIG. 2, FIG. 3, or FIG. 4) configured to identify a state of a connection between the second power amplifier and the first power supply module and a state of a connection between the second power amplifier and the second power supply module, wherein the detection module may be configured to output a power control signal based on detecting that the second power amplifier is connected to the first power supply module and the second power supply module, wherein power supply to the second power amplifier from the first power supply module or the second power supply module may be shut off based on the power control signal of the detection module.

According to various example embodiments, the electronic device may further include a processor (e.g., the processor 120 FIG. 1 or the communication processor 202 of FIG. 2, FIG. 3, or FIG. 4) operatively connected to the first power amplifier, the second power amplifier, the third power amplifier, the first power supply module, the second power supply module, and the detection module, wherein the processor may be configured to select the first power supply module or the second power supply module as a power supply module for restricting the power supply to the second power amplifier, based on the power control signal.

According to various example embodiments, the processor may be configured to: select the second power supply module as the power supply module for restricting the power supply to the second power amplifier, based on the power control signal, based on determining that the first power supply module supplies power to the first power amplifier or the second power amplifier, and may select the first power supply module as the power supply module for restricting the power supply to the second power amplifier, based on the power control signal, based on determining that the second power supply module supplies power to the second power amplifier or the third power amplifier.

According to various example embodiments, the first power supply module may include a first power supply (e.g., the first power supply 246 of FIG. 2, FIG. 3, or FIG. 4), a first switch (e.g., the first switch 244 of FIG. 2, FIG. 3, or FIG. 4) configured to connect the first power supply to the first power amplifier or the second power amplifier, and a first switch control circuit (e.g., the first control module 242 of FIG. 2, FIG. 3, or FIG. 4) configured to control driving of the first switch, wherein the first switch control circuit may be configured terminate the driving of the first switch, based on the power control signal, based on the first power supply module being selected by the processor as the power supply module for restricting the power supply to the second power amplifier.

According to various example embodiments, the first switch control circuit may include a plurality of transistors configured in a push-pull structure.

According to various example embodiments, the second power supply module may include a second power supply (e.g., the second power supply 256 of FIG. 2, FIG. 3, or FIG. 4), a second switch (e.g., the second switch 254 of FIG. 2, FIG. 3, or FIG. 4) configured to connect the second power supply to the second power amplifier or the third power amplifier, and a second switch control circuit (e.g., the second control module 252 of FIG. 2, FIG. 3, or FIG. 4) configured to control driving of the second switch, wherein the second switch control circuit may terminate the driving of the second switch, based on the power control signal, based on the second power supply module being selected by the processor as the power supply module for restricting the power supply to the second power amplifier.

According to various example embodiments, the second switch control circuit may include a plurality of transistors configured in a push-pull structure.

According to various example embodiments, the processor may be configured to output a first control signal indicating that the first power supply module is connected to the first power amplifier or the second power amplifier, and to output a second control signal indicating that the second power supply module is connected to the second power amplifier or the third power amplifier.

According to various example embodiments, the detection module may be configured to: identify the state of the connection between the second power amplifier and the first power supply module, based on the first control signal, and identify the state of the connection between the second power amplifier and the second power supply module, based on the second control signal.

According to various example embodiments, the electronic device may further include: a control circuit (e.g., the third control circuit 300 of FIG. 3 or FIG. 4) configured to control driving of the second power amplifier, wherein the control circuit may be configured to terminate the driving of the second power amplifier, based on the power control signal.

According to various example embodiments, an electronic device (e.g., the electronic device 101 of FIG. 1, FIG. 2, FIG. 3, or FIG. 4) may include: at least one antenna (e.g., the antenna module 197 of FIG. 1), a communication processor (e.g., the processor 120 FIG. 1 or the communication processor 202 of FIG. 2, FIG. 3, or FIG. 4), and a wireless communication circuit (e.g., the wireless communication module 192 of FIG. 1, or the RFIC 204 and the RFFE 206 of FIG. 2, FIG. 3, or FIG. 4) electrically connected to the at least one antenna and the communication processor, wherein the wireless communication circuit may include a first power amplifier (e.g., the first power amplifier 210 of FIG. 2, FIG. 3, or FIG. 4) configured to amplify a first signal provided from the communication processor and to output the first signal to the at least one antenna, a second power amplifier (e.g., the second power amplifier 220 of FIG. 2, FIG. 3, or FIG. 4) configured to amplify a second signal provided from the communication processor and to output the second signal to the at least one antenna, a third power amplifier (e.g., the third power amplifier 230 of FIG. 2, FIG. 3, or FIG. 4) configured to amplify a third signal provided from the communication processor and to output the third signal to the at least one antenna, a first power supply module (e.g., the first power supply module 240 of FIG. 2, FIG. 3, or FIG. 4) including a power supply configured to supply power to the first power amplifier or the second power amplifier, a second power supply module including a power supply (e.g., the second power supply module 250 of FIG. 2, FIG. 3, or FIG. 4) configured to supply power to the second power amplifier or the third power amplifier, and a detection module (e.g., the detection module 260 of FIG. 2, FIG. 3, or FIG. 4) comprising circuitry configured to identify a state of a connection between the second power amplifier and the first power supply module and a state of a connection between the second power amplifier and the second power supply module, wherein the detection module may be configured to output a power control signal based on detecting that the second power amplifier is connected to the first power supply module and the second power supply module, wherein power supply to the second power amplifier from the first power supply module or the second power supply module may be shut off based on the power control signal of the detection module.

According to various example embodiments of the disclosure, when at least one power supplier having an output switching structure selectively supplies power to a plurality of power amplifiers, an electronic device may control an output switch of the power supplier so that outputs of a plurality of power suppliers are not simultaneously connected to one power amplifier during the operation of the power amplifier, thereby preventing and/or reducing the power supplier and/or the power amplifier from being damaged and preventing and/or reducing a voltage drop in power of the power amplifier to improve power efficiency.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a first power amplifier;
    a second power amplifier;
    a third power amplifier;
    a first power supply module including a power supply configured to supply power to the first power amplifier or the second power amplifier;
    a second power supply module including a power supply configured to supply power to the second power amplifier or the third power amplifier; and
    a detection module comprising circuitry configured to identify a state of a connection between the second power amplifier and the first power supply module and a state of a connection between the second power amplifier and the second power supply module,
    wherein the detection module is configured to output a power control signal based on detecting that the second power amplifier is connected to the first power supply module and the second power supply module, and
    wherein power supply to the second power amplifier from the first power supply module or the second power supply module is shut off based on the power control signal of the detection module.

2. The electronic device of claim 1, further comprising a processor operatively connected to the first power amplifier, the second power amplifier, the third power amplifier, the first power supply module, the second power supply module, and the detection module,
    wherein the processor is configured to select the first power supply module or the second power supply module as a power supply module for restricting the power supply to the second power amplifier, based on the power control signal.

3. The electronic device of claim 2, wherein the processor is configured to: select the second power supply module as the power supply module for restricting the power supply to the second power amplifier, based on the power control signal, based on determining that the first power supply module supplies power to the first power amplifier or the second power amplifier, and
    select the first power supply module as the power supply module for restricting the power supply to the second power amplifier, based on the power control signal, based on determining that the second power supply module supplies power to the second power amplifier or the third power amplifier.

4. The electronic device of claim 2, wherein the first power supply module comprises a first power supply, a first switch configured to connect the first power supply to the first power amplifier or the second power amplifier, and a first switch control circuit configured to control driving of the first switch, and
    wherein the first switch control circuit is configured to terminate the driving of the first switch, based on the power control signal, based on the first power supply module being selected by the processor as the power supply module for restricting the power supply to the second power amplifier.

5. The electronic device of claim 4, wherein the first switch control circuit comprises a plurality of transistors configured in a push-pull arrangement.

6. The electronic device of claim 2, wherein the second power supply module comprises a second power supply, a second switch configured to connect the second power supply to the second power amplifier or the third power amplifier, and a second switch control circuit configured to control driving of the second switch, and
    wherein the second switch control circuit is configured to terminate the driving of the second switch, based on the power control signal, based on the second power supply module being selected by the processor as the power supply module for restricting the power supply to the second power amplifier.

7. The electronic device of claim 6, wherein the second switch control circuit comprises a plurality of transistors configured in a push-pull arrangement.

8. The electronic device of claim 2, wherein the processor is configured to: output a first control signal indicating that the first power supply module is connected to the first power amplifier or the second power amplifier, and
    output a second control signal indicating that the second power supply module is connected to the second power amplifier or the third power amplifier.

9. The electronic device of claim 8, wherein the detection module is configured to: identify a state of the connection between the second power amplifier and the first power supply module, based on the first control signal, and
    identify the state of the connection between the second power amplifier and the second power supply module, based on the second control signal.

10. The electronic device of claim 1, further comprising a control circuit configured to control driving of the second power amplifier,
    wherein the control circuit is configured to terminate the driving of the second power amplifier, based on the power control signal.

11. A method of operating an electronic device, the method comprising:
    identifying a power supply module connected to a second power amplifier among a plurality of power amplifiers including a first power amplifier, a second power amplifier and a third power amplifier, based on the second power amplifier being connected to a first power supply module and the second power supply module, selecting the first power supply module or the second power supply module as a power supply module for restricting the power supply to the second power amplifier, the first power supply module supplying power to the first power amplifier or the second power amplifier, the second power supply module supplying power to the second power amplifier or the third power amplifier, and terminating power supply to the second power amplifier from the first power supply module or the second power supply module.

12. The method of claim 11, wherein the selecting the first power supply module or the second power supply module comprises: selecting the first power supply module as the power supply module for restricting the power supply to the second power amplifier, based on determining that the second power supply module supplies power to the second power amplifier or the third power amplifier.

13. The method of claim 12, wherein the terminating of the power supply comprises: terminating driving of a first switch connecting a first power supply of the first power supply module to the first power amplifier or the second power amplifier, based on the first power supply module being selected as the power supply module for restricting the power supply to the second power amplifier.

14. The method of claim 11, wherein the selecting the first power supply module or the second power supply module comprises: selecting the second power supply module as the power supply module for restricting the power supply to the second power amplifier, based on determining that the first power supply module supplies power to the first power amplifier or the second power amplifier.

15. The method of claim 14, wherein the terminating of power supply comprises: terminating driving of a second switch connecting a second power supply of the second power supply module to the second power amplifier or the third power amplifier, based on the second power supply module being selected by the communication processor as the power supply module for restricting the power supply to the second power amplifier.

16. An electronic device comprising:
at least one antenna;
a communication processor; and
a wireless communication circuit configured to be electrically connected to the at least one antenna and the communication processor,
wherein the wireless communication circuit comprises
a first power amplifier configured to amplify a first signal provided from the communication processor and to output the first signal to the at least one antenna,
a second power amplifier to amplify a second signal provided from the communication processor and to output the second signal to the at least one antenna,
a third power amplifier to amplify a third signal provided from the communication processor and to output the third signal to the at least one antenna,
a first power supply module including a power supply configured to supply power to the first power amplifier or the second power amplifier,
a second power supply module including a power supply configured to supply power to the second power amplifier or the third power amplifier, and
a detection module comprising circuitry configured to identify a state of a connection between the second power amplifier and the first power supply module and a state of a connection between the second power amplifier and the second power supply module,
wherein the detection module is configured to output a power control signal based on detecting that the second power amplifier is connected to the first power supply module and the second power supply module, and
wherein power supply to the second power amplifier from the first power supply module or the second power supply module is shut off based on the power control signal of the detection module.

17. The electronic device of claim 16, wherein the communication processor is configured to select the first power supply module or the second power supply module as a power supply module for restricting the power supply to the second power amplifier, based on the power control signal.

18. The electronic device of claim 17, wherein the communication processor is configured to: select the second power supply module as the power supply module for restricting the power supply to the second power amplifier, based on the power control signal, based on determining that the first power supply module supplies power to the first power amplifier or the second power amplifier, and
select the first power supply module as the power supply module for restricting the power supply to the second power amplifier, based on the power control signal, based on determining that the second power supply module supplies power to the second power amplifier or the third power amplifier.

19. The electronic device of claim 16, wherein the first power supply module comprises a first power supply, a first switch configured to connect the first power supply to the first power amplifier or the second power amplifier, and a first switch control circuit configured to control driving of the first switch, and
wherein the first switch control circuit is configured to terminate the driving of the first switch, based on the power control signal, based on the first power supply module being selected by the communication processor as the power supply module for restricting the power supply to the second power amplifier.

20. The electronic device of claim 16, wherein the second power supply module comprises a second power supply, a second switch configured to connect the second power supply to the second power amplifier or the third power amplifier, and a second switch control circuit configured to control driving of the second switch, and
wherein the second switch control circuit is configured to terminate the driving of the second switch, based on the power control signal, based on the second power supply module being selected by the communication processor as the power supply module for restricting the power supply to the second power amplifier.

* * * * *